United States Patent [19]

Figueroa et al.

[11] 4,346,394
[45] Aug. 24, 1982

[54] GALLIUM ARSENIDE BURRUS FET STRUCTURE FOR OPTICAL DETECTION

[75] Inventors: Luis Figueroa, Woodland Hills; Huan-Wun Yen, Westlake Village, both of Calif.

[73] Assignee: Hughes Aircraft Company, Culver City, Calif.

[21] Appl. No.: 133,183

[22] Filed: Mar. 24, 1980

[51] Int. Cl.³ .............. H01L 27/14; H01L 29/80; H01L 31/10
[52] U.S. Cl. .................................. 357/30; 357/16; 357/22; 357/55; 357/4
[58] Field of Search ............... 357/30, 23, 4, 13, 16, 357/55

[56] References Cited

U.S. PATENT DOCUMENTS

| | | | |
|---|---|---|---|
| 3,651,423 | 3/1972 | Sewell | 331/66 |
| 3,662,289 | 5/1972 | Dienst | 332/3 |
| 4,152,713 | 5/1979 | Copeland | 357/55 X |
| 4,157,556 | 6/1979 | Decker | 357/16 X |
| 4,176,367 | 11/1979 | Uematsu | 357/16 X |
| 4,212,020 | 7/1980 | Yariv | 357/4 X |

OTHER PUBLICATIONS

J. Pan, 'GaAs MESFET for High Speed Optical Detection', 22nd SPIE International Tech. Symposium, San Diego, Cal. 28-31, Aug. 1978.

*Primary Examiner*—Martin H. Edlow
*Attorney, Agent, or Firm*—David W. Collins; W. H. MacAllister

[57] ABSTRACT

A GaAs FET structure with a high electric field region, or active region, contacted by source, gate and drain electrodes is provided which can be used for high speed optical detection or for microwave oscillator optical injection locking. The device provides for efficient coupling of optical radiation into the active region through an opening in a semi-insulating substrate used to support the device. A buffer layer between the active region and the substrate prevents leakage current to the substrate, permits a larger illumination window for improved optical coupling and provides mechanical support for the FET detector. GaAs photodetectors are also provided by eliminating the gate electrode.

8 Claims, 2 Drawing Figures

GALLIUM ARSENIDE BURRUS FET STRUCTURE FOR OPTICAL DETECTION

The Government has rights in this invention pursuant to Contract No. N00173-78-C-0192 awarded by the Department of the Navy.

BACKGROUND OF THE INVENTION

1. Field of the Invention

The invention relates to a GaAs FET structure having a high electric field region which can be used for high speed optical detection or for microwave oscillator optical injection locking. More particularly, the invention relates to a device configured such that optical radiation is efficiently coupled into the high electric field region.

2. Description of the Prior Art

Gallium arsenide field effect transistors (FET's) are well-known; see, e.g., Vol. 24, Institute of Electrical and Electronic Engineers, Microwave Theory and Technology, pp. 279-300 (1976). However, these devices are designed for optimal microwave performance only. Therefore, they are not necessarily suitable for efficient optical coupling.

Other investigators have employed conventional FET's as optical detectors; see, e.g., Technical Digest, International Electron Devices Meeting, pp. 120-123 (1978), Vol. 13, Electronics Letters, p. 193 (Mar. 15, 1977) and Vol. 19, Japanese Journal of Applied Physics, pp. L27-L29 (1980). However, these FET's also were optimized only for microwave performance.

SUMMARY OF THE INVENTION

In accordance with the invention, an integrated optical photodetector comprises:

(a) a substrate of semi-insulating III-V semiconductor material, having at least one opening therein;

(b) a buffer layer of mixed III-V semiconductor material, supported on at least a portion of the substrate, at least one portion of which buffer layer is exposed by the opening; and (c) a detector supported on the buffer layer and operably associated with the opening. The detector includes an active region and a pair of electrodes contacting the active region. The buffer layer is undoped and has an indirect bandgap. The bandgap is larger than that of the active region.

The device is fabricated by a process comprising:

(a) forming a buffer layer of mixed III-V semiconductor material on at least a portion of a substrate of semi-insulating III-V semiconductor material;

(b) forming at least one opening in the substrate to expose at least one portion of the buffer layer; and (c) forming a detector on the buffer layer operably associated with the opening by a process including:
  (i) forming an active region on the buffer layer, and
  (ii) forming a pair of electrodes in contact with the active region.

The advantage of the device is that incoming optical radiation can be efficiently coupled into the active region (high electric field region) through the opening in the semi-insulating substrate, thereby optimizing optical characteristics.

DETAILED DESCRIPTION OF THE INVENTION

The discussion that follows relates specifically to GaAs devices including mixed (AlGa)As regions, useful for high speed optical detection, for microwave oscillator optical injection locking and other microwave-optical interactions. Such GaAS devices typically operate at an optical wavelength of about 0.6 to 0.9 $\mu$m and at microwave frequencies ranging up to at least about 5 GHz. However, it will be understood that the invention is suitable for other III-V devices such as InP, used in similar applications but in a different optical wavelength range (about 1 to 1.5 $\mu$m for InP).

Figure 1:
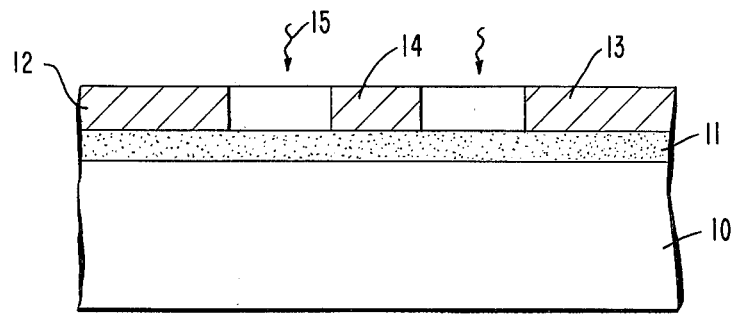
FIG. 1 is a cross-sectional view of a GaAs FET in accordance with the prior art.

In order to achieve optical injection locking, mixing and high speed detection using GaAs FET amplifiers or oscillators, it is desired to improve the optical coupling efficiency of GaAs FET's. FIG. 1 depicts a conventional GaAs FET structure. The structure comprises a semi-insulating substrate 10, such as GaAs, typically having a resistivity of about $10^7$ ohm-cm. The substrate supports an active region 11 of typically III-V semiconductor material, here, n-GaAs doped to about $10^{17}/cm^3$ and having a thickness ranging from about 0.5 to 1 $\mu$m. The purpose of the active region is to provide a region for the generation and control of carriers. Electrodes 12 and 13 are in direct contact with the active region. For an FET device, electrodes 12 and 13 serve as source and drain regions, respectively, and gate electrode 14 contacts a portion of active region 11 and is spaced apart from the source and drain electrodes. In the case of a photoconductor, gate electrode 14 would be absent. In either case, the front side of the device is illuminated by radiation 15.

The prior art devices operate through the photoconductive process by which injected photons produce a change in the conductivity of the active layer. This results in an induced photoconductive current.

The disadvantage with prior art FET's is the small active area available for optical absorption due to the presence of gate electrode 14. This is especially true for FET's with a short channel length (the distance between electrodes 12 and 13).

Figure 2:
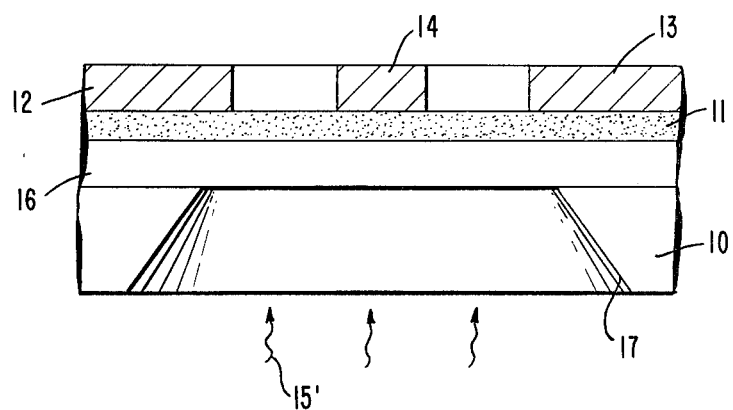
FIG. 2 in cross-section depicts a GaAs FET in accordance with the invention.

In accordance with the invention, an FET structure with improved optical coupling efficiency is provided. The structure is depicted in FIG. 2, which shows a structure similar to that in FIG. 1, except that an undoped gallium aluminum arsenide layer 16, called the "buffer" layer herein, is provided between the substrate 10 and active region 11. An opening 17 is provided through the substrate for efficiently introducing optical radiation 15' into the structure from the backside.

Semiconductor layers 11 and 16 are conveniently grown by conventional liquid phase epitaxy (LPE) techniques. The FET electrode pattern is defined as usual. Following these procedures, at least one well or opening 17 is etched in the semi-insulating substrate. Although only one opening is shown, it will be understood that a plurality of openings, each associated with a discrete device, are formed in the substrate. The position of the opening is aligned carefully with the FET channel using an infrared microscope. In the case of using undoped $Al_xGa_{1-x}As$ as the buffer layer, a selective etchant such as superoxol ($NH_4OH-H_2O_2$) is preferably used, since it etches only GaAs and not (Al-Ga)As. Non-selective etchants may alternatively be used for a portion of the etching if desired; however, the final etching must use a selective etchant in order to control the thickness of the buffer layer.

The composition of the buffer layer 16 for a GaAs FET is given by $Al_xGa_{1-x}As$, where x is at least 0.37. The value of x should be as high as possible, since this permits employing shorter wavelengths, which in turn implies a wider wavelength span (larger bandgap) and also lowers mobility, which has the effect of reducing the leakage current. On the other hand, x should not be too high, since traps can be created at the interface, resulting in long lifetimes which can decrease the high frequency performance. Further, high x compositions become difficult to grow. Below the value of x of 0.37, the mobility increases rapidly. Above a value of about 0.7, growth problems result. Preferably, x ranges from about 0.4 to 0.5 and most preferably is about 0.4.

The thickness of the buffer layer is at least about 5 $\mu$m in order to provide mechanical support. If the thickness is too great, however, the device leakage current may be too high and may prevent pinchoff of the FET and reduce the efficiency of the detector. Accordingly, the thickness of the buffer layer should not exceed about 25 $\mu$m and preferably ranges from about 5 to 10 $\mu$m.

The opening 17 is formed by employing a preferential etchant that stops at the buffer layer. For devices employing a semi-insulating substrate of GaAs and a buffer layer of (AlGa)As, an example of such an etchant is superoxol, as mentioned above, which comprises an aqueous solution of 29% $NH_4OH$ and 30% $H_2O_2$. The solution is made up to a pH ranging from about 8 to 9. As is well-known, the pH determines the ratio of $NH_4OH$ to $H_2O_2$. A pH greater than about 9 results in an undesirably fast etch, while a pH less than about 8 results in pitting of the semiconductor surface. Preferably, the pH is about 8.5.

Prior to forming opening 17 in the substrate, the substrate is preferably thinned in order to reduce the etching time and to avoid having to fabricate a large window opening, since the superoxol etchant typically etches at an angle of about 15° to 40°.

The thickness of the active layer 11 is of the same order as the optical attenuation depth, which varies with wavelength. For devices contemplated herein, that thickness ranges from about 0.5 to 1 $\mu$m. In all other respects, the detector portion of the device is provided by conventional processing using well-known techniques.

The source and drain contacts (electrodes 12 and 13) are conveniently formed by depositing layers of gold-germanium (typically about 88% Au-12% Ge), nickel and gold, followed by heat treating, and the gate contact (electrode 14) is formed by depositing aluminum. These depositions are well-known in the art and form no part of this invention. Individual detectors are isolated by forming mesas. The mesa etch is superoxol.

While only one device is depicted in FIG. 2, it will be understood that a plurality of devices are fabricated in the substrate. The finished devices may be separated into individual detectors, as by slicing and dicing the substrate, employing well-known techniques, or formed into one- or two-dimensional arrays of detectors by suitable interconnection.

The FET detector functions like a photoconductor except that (1) the gate can control the dark current and (2) the generation of carriers can change the depletion layer width, thus changing the drain-source current. Further, phototransistor action may be achieved by connecting a resistor (not shown) in series with the gate. Thus, if the gate acts as a photodiode, a voltage is induced across the gate and a corresponding change in the drain-source current occurs.

The foregoing discussion has been concerned with employing an FET in conjunction with light detection. A photodetector may alternatively be employed, using electrodes 12 and 13 and omitting gate electrode 14. Such photodetectors function as a photoconductor. The photoconductivity is changed by incident optical radiation and thus an induced current is generated.

While the FET and the photodetector structures are per se well-known, it is the combination of these structures with light detection and the geometry employed that is considered novel.

In the structure disclosed herein, the buffer layer has several functions. It serves as an optical window, transparent for photon energy lower than the bandgap energy of the buffer layer. The buffer layer also reduces GaAs surface recombination loss, provides mechanical support and serves as the stop for selective etching during fabrication. A prime advantage of the structure of the invention is that the entire channel layer can be uniformly illuminated and the active layer is large because the gate electrode does not interfere with incident optical radiation. By not doping the buffer layer, its conductivity may be kept low. By choosing an appropriate percent of aluminum such that the buffer layer becomes indirect bandgap, the carrier mobility in the layer may be further reduced. Since the bandgap energy of the buffer layer is higher than that of the channel layer, the heterojunction also serves to confine charge carriers in the channel layer. Thus, leakage current due to the presence of the buffer layer will be minimized.

Advantageously, the structure of the invention permits coupling of optical fibers, such as fiber pigtails, to the device through opening 17.

EXAMPLES

A device similar to that depicted in FIG. 2 has a source-drain spacing, or channel length, of 15 $\mu$m and a gate length of 5 $\mu$m. The active region 11 is 0.5 $\mu$m thick and doped with n-type carriers (Sn) to about $10^{17}/cm^3$ (mobility about 3,500 $cm^3$/V-sec). The buffer layer 16 of $Al_xGa_{1-x}As$ is 5 $\mu$m thick, with x=0.4 and a background n-type doping of about $5 \times 10^{15}/cm^3$ (mobility about 100 $cm^2$/V-sec).

The opening 17 in substrate 10 is a square about 50 $\mu$m $\times$ 50 $\mu$m. The source and drain contacts 12 and 13 are formed by evaporating 88% Au-12% Ge (1,500 Å), Ni (1,000 Å) and Au (2,000 Å) and heat treating at 460° C. for 30 sec; the gate electrode 14 is formed by evaporating Al (2,000 Å).

The device evidences the following typical characteristics: DC light sensitivity of about 2 to 10 mA/mW, RF cutoff frequency greater than 4 GHz, with an RF sensitivity of about 0.1 mA/mW, drain-source current ($I_{DS}$) of about 10 to 20 mA, drain-source voltage ($V_{DS}$) of about 2 to 5 V, transconductance of about 2 to $4 \times 10^{-3}$ mho and gate voltage ($V_g$) of about 0 to $-5$ V.

What is claimed is:

1. An integrated optical photodetector comprising:
    (a) a substrate of semi-insulating III-V semiconductor material and
    (b) at least one detector supported on said substrate, said detector including:
        (i) an active region of III-V semiconductor material, and (ii) a pair of electrodes contacting said active region, characterized by (c) an undoped buffer layer of mixed III–V semiconductor material provided between said substrate and said active region, said buffer layer having an indirect bandgap, said bandgap being larger than that of said active region; and (d) at least one opening in said substrate which exposes a portion of said buffer layer, said at least one opening operably associated with said at least one detector for introducing incident optical radiation thereon.

2. The device of claim 1 comprising:

(a) a substrate of semi-insulating GaAs having at least one opening therein;

(b) a buffer layer of undoped $Al_xGa_{1-x}As$, where x ranges from about 0.37 to 0.7, said buffer layer supported on said substrate, at least one portion of which buffer layer is exposed by said at least one opening; and (c) at least one detector supported on said buffer layer and operably associated with said at least one opening, said detector including:

(i) an active region of n-type GaAs, and (ii) a pair of electrodes contacting said active region.

3. The device of claim 1 or 2 further comprising a gate region contacting a portion of said active region, said gate region approximately centered opposite said at least one opening and spaced apart from said pair of electrodes.

4. The device of claim 2 in which x ranges from about 0.4 to 0.5.

5. The device of claim 4 in which x is about 0.4.

6. The device of claim 2 in which the thickness of said buffer layer ranges from about 5 to 25 $\mu$m.

7. The device of claim 6 in which the thickness of said buffer layer ranges from about 5 to 10 $\mu$m.

8. The device of claim 2 in which the thickness of said active region ranges from about 0.5 to 1 $\mu$m.

* * * * *